US012679760B2

(12) United States Patent
Nishimiya

(10) Patent No.: US 12,679,760 B2
(45) Date of Patent: Jul. 14, 2026

(54) ALKALI-FREE GLASS PANEL

(71) Applicant: Nippon Electric Glass Co., Ltd., Shiga (JP)

(72) Inventor: Mayu Nishimiya, Shiga (JP)

(73) Assignee: NIPPON ELECTRIC GLASS CO., LTD., Shiga (JP)

( * ) Notice: Subject to any disclaimer, the term of this patent is extended or adjusted under 35 U.S.C. 154(b) by 828 days.

(21) Appl. No.: 17/920,962

(22) PCT Filed: Jun. 21, 2021

(86) PCT No.: PCT/JP2021/023406
§ 371 (c)(1),
(2) Date: Oct. 24, 2022

(87) PCT Pub. No.: WO2021/261445
PCT Pub. Date: Dec. 30, 2021

(65) Prior Publication Data
US 2023/0212060 A1      Jul. 6, 2023

(30) Foreign Application Priority Data

| | | |
|---|---|---|
| Jun. 23, 2020 | (JP) | 2020-107591 |
| Oct. 1, 2020 | (JP) | 2020-166643 |
| Dec. 14, 2020 | (JP) | 2020-206786 |
| Feb. 10, 2021 | (JP) | 2021-019753 |

(51) Int. Cl.
*C03C 3/091*      (2006.01)
*H10K 59/10*      (2023.01)

(52) U.S. Cl.
CPC ............. *C03C 3/091* (2013.01); *H10K 59/10* (2023.02); *C03C 2201/32* (2013.01)

(58) Field of Classification Search
CPC ........................... C03C 3/091; C03C 2201/32
See application file for complete search history.

(56) References Cited

U.S. PATENT DOCUMENTS

| | | | | |
|---|---|---|---|---|
| 2012/0058306 | A1* | 3/2012 | Miwa | C03C 23/006 |
| | | | | 428/141 |
| 2012/0149544 | A1 | 6/2012 | Nagai et al. | |
| 2013/0274086 | A1 | 10/2013 | Tsujimura et al. | |
| 2013/0288877 | A1 | 10/2013 | Tsujimura et al. | |
| 2014/0049708 | A1 | 2/2014 | Murata et al. | |
| 2015/0045203 | A1 | 2/2015 | Tokunaga et al. | |
| 2015/0072130 | A1 | 3/2015 | Tokunaga et al. | |
| 2015/0087495 | A1 | 3/2015 | Nishizawa et al. | |
| 2015/0299028 | A1 | 10/2015 | Nishizawa et al. | |
| 2017/0217826 | A1 | 8/2017 | Ono et al. | |
| 2018/0141849 | A1 | 5/2018 | Saito et al. | |

| | | | |
|---|---|---|---|
| 2019/0322568 | A1 | 10/2019 | Saito |
| 2019/0345055 | A1 | 11/2019 | Saito |
| 2020/0165155 | A1 | 5/2020 | Saito |

FOREIGN PATENT DOCUMENTS

| | | |
|---|---|---|
| JP | 2004-142962 | 5/2004 |
| JP | 2012-106919 | 6/2012 |
| JP | 2012-184146 | 9/2012 |
| JP | 2016-029001 | 3/2016 |
| JP | 2016-113363 | 6/2016 |
| JP | 2017-030975 | 2/2017 |
| JP | 2018-100208 | 6/2018 |
| KR | 10-2018-0008386 | 1/2018 |
| TW | 201247585 | 12/2012 |
| TW | 201427921 | 7/2014 |
| WO | 2011/001920 | 1/2011 |
| WO | 2012/077609 | 6/2012 |
| WO | 2012/090783 | 7/2012 |
| WO | 2013/161902 | 10/2013 |
| WO | 2013/180220 | 12/2013 |
| WO | 2013/183626 | 12/2013 |
| WO | 2016/063981 | 4/2016 |
| WO | 2018/116953 | 6/2018 |
| WO | 2018/123675 | 7/2018 |
| WO | 2019/140427 | 7/2019 |

OTHER PUBLICATIONS

English text from CN 102690056 (Year: 2012).*
Office Action issued Sep. 25, 2024 in corresponding Taiwanese Patent Application No. 110122501, with English-language translation of the search report.
International Search Report issued Aug. 31, 2021 in International (PCT) Application No. PCT/JP2021/023406, with English translation.
International Preliminary Report on Patentability and Written Opinion of the International Searching Authority issued Dec. 13, 2022 in International (PCT) Application No. PCT/JP2021/023406.
Request for the Submission of an Opinion issued Oct. 21, 2025 in corresponding Korean Patent Application No. 10-2022-7032542, with English-language Translation.
Notice of Reasons for Refusal issued Dec. 3, 2025 in corresponding Japanese Patent Application No. 2022-531977, with English language translation.

* cited by examiner

*Primary Examiner* — Benjamin L Utech
(74) *Attorney, Agent, or Firm* — Wenderoth, Lind & Ponack, L.L.P.

(57)      ABSTRACT

The present invention provides an alkali-free glass sheet, including as a glass composition, in terms of mol %, 64% to 71% of $SiO_2$, 12.5% to 17% of $Al_2O_3$, 0% to 4% of $B_2O_3$, 0% to 0.5% of $Li_2O+Na_2O+K_2O$, 6% to 11% of MgO, 3% to 11% of CaO, 0% to 6% of SrO, 0% to 1% of BaO, and 14% to 19% of MgO+CaO+SrO+BaO, and having a mole percent ratio $(Al_2O_3/CaO)\times\{B_2O_3/(MgO+CaO+SrO+BaO)\}$ of from 0 to 0.5, a mole percent ratio $MgO/(CaO+SrO)$ of from 0.5 to 1.5, a mole percent ratio $(MgO+CaO+SrO+BaO-Al_2O_3)\times B_2O_3$ of from 1 to 10, and a mole percent ratio $SiO_2\times CaO/MgO$ of from 30 to 90.

7 Claims, No Drawings

ALKALI-FREE GLASS PANEL

TECHNICAL FIELD

The present invention relates to an alkali-free glass sheet, and more specifically, to an alkali-free glass sheet suitable for an OLED display.

BACKGROUND ART

An electronic device such as an OLED display is used in applications, such as a flexible device and a display of a cellular phone, because the electronic device is thin, is excellent in displaying a moving image, and has low power consumption.

A glass sheet is widely used as a substrate of an OLED display. The glass sheet for this application is mainly required to satisfy the following characteristics.

(1) To be substantially free of an alkali metal oxide, that is, to be alkali-free glass (to have a content of an alkali metal oxide of 0.5 mol % or less in a glass composition) in order to prevent a situation in which an alkali ion is diffused in a heat treatment step into a semiconductor substance having been formed into a film.

(2) To be formed by an overflow down-draw method, by which an improvement in surface quality is easily achieved, and to be excellent in productivity, particularly excellent in meltability and devitrification resistance in order to achieve a reduction in cost of the glass sheet.

(3) To have a high strain point in order to reduce the thermal shrinkage of the glass sheet in a low temperature polysilicon (LTPS) process or an oxide TFT process.

CITATION LIST

Patent Literature 1: JP 2012-106919 A

SUMMARY OF INVENTION

Technical Problem

Incidentally, an OLED device has been widely deployed also in an OLED TV. There are strong demands for an increase in size and a reduction in thickness of the OLED TV, and there is an increasing demand for a display having a high resolution of 8K or the like. Accordingly, a glass sheet for those applications is required to have such thermal dimensional stability as to be able to withstand the high resolution demand while achieving an increase in size and a reduction in thickness. Further, for the OLED TV, in order to reduce a difference in price from a liquid crystal display, a reduction in cost is required, and also the glass sheet is similarly required to be reduced in cost. However, when the glass sheet is increased in size and reduced in thickness, the glass sheet is liable to be deflected, and a manufacturing cost rises.

The glass sheet formed by a glass manufacturer is subjected to, for example, cutting, annealing, testing, and washing steps, and during these steps, the glass sheet is loaded into a cassette in which a plurality of shelves are formed and is discharged therefrom. The cassette is generally configured so that pairing two sides of the glass sheet are placed on shelves formed on left and right inner surfaces of the cassette to allow the glass sheet to be held in a horizontal direction. However, a large and thin glass sheet has a large deflection amount, and hence at the time of loading of the glass sheet into the cassette, part of the glass sheet is brought into contact with the cassette, and the glass sheet is liable to be broken. At the time of discharge, the glass sheet largely swings and is liable to be unstable. The cassette having such configuration is also used in an electronic device manufacturer, resulting in occurrence of similar defects. In order to solve the above-mentioned problems, a method involving increasing the Young's modulus of the glass sheet, to thereby reduce the deflection amount thereof is effective.

In addition, as described above, it is required that the strain point of the glass sheet be increased in order to reduce the thermal shrinkage of a large glass sheet in the LTPS process or the oxide TFT process for obtaining a display having a high resolution.

However, when the Young's modulus and the strain point of the glass sheet are to be increased, the glass composition loses its balance, with the result that productivity is reduced, and particularly the devitrification resistance is liable to be remarkably reduced, and the glass sheet cannot be formed by an overflow down-draw method owing to an increase in liquidus viscosity. In addition, the meltability is reduced or a glass forming temperature is increased, with the result that the lifetime of a forming trough is liable to be shortened. As a result, the raw sheet cost of the glass sheet rises.

Thus, the present invention has been devised in view of the above-mentioned circumstances, and a technical object of the present invention is to provide an alkali-free glass sheet which is excellent in productivity and has a sufficiently high strain point and a sufficiently high Young's modulus.

Solution to Problem

The inventor of the present invention has repeated various experiments, and as a result, has found that the above-mentioned technical object can be achieved by strictly restricting the glass composition of an alkali-free glass sheet. Thus, the finding is proposed as the present invention. That is, according to one embodiment of the present invention, there is provided an alkali-free glass sheet, comprising as a glass composition, in terms of mol %, 64% to 71% of $SiO_2$, 12.5% to 17% of $Al_2O_3$, 0% to 4% of $B_2O_3$, 0% to 0.5% of $Li_2O+Na_2O+K_2O$, 6% to 11% of MgO, 3% to 11% of CaO, 0% to 6% of SrO, 0% to 1% of BaO, and 14% to 19% of MgO+CaO+SrO+BaO, and having a mole percent ratio $(Al_2O_3/CaO)\times\{B_2O_3/(MgO+CaO+SrO+BaO)\}$ of from 0 to 0.5, a mole percent ratio MgO/(CaO+SrO) of from 0.5 to 1.5, a mole percent ratio $(MgO+CaO+SrO+BaO—Al_2O_3)\times B_2O_3$ of from 1 to 10, and a mole percent ratio $SiO_2\times CaO/MgO$ of from 30 to 90. Herein, the "$Li_2O+Na_2O+K_2O$" refers to the total content of $Li_2O$, $Na_2O$, and $K_2O$. The "MgO+CaO+SrO+BaO" refers to the total content of MgO, CaO, SrO, and BaO. The "mole percent ratio $(Al_2O_3/CaO)\times\{B_2O_3/(MgO+CaO+SrO+BaO)\}$" refers to a value obtained by multiplying: a value obtained by dividing the content of $Al_2O_3$ by the content of CaO; by a value obtained by dividing the content of $B_2O_3$ by the total content of MgO, CaO, SrO, and BaO. The "MgO/(CaO+SrO)" refers to a value obtained by dividing the content of MgO by the total content of CaO and SrO. The "$(MgO+CaO+SrO+BaO—Al_2O_3)\times B_2O_3$" refers to a value obtained by multiplying: a value obtained by subtracting the content of $Al_2O_3$ in terms of mol % from the total content of MgO, CaO, SrO, and BaO in terms of mol %; by the content of $B_2O_3$ in terms of mol %. The "$SiO_2\times CaO/MgO$" refers to a value obtained by dividing: a value obtained by multiplying the content of $SiO_2$ in terms of mol % by the content of CaO in terms of mol %; by the content of MgO in terms of mol %.

In addition, it is preferred that the alkali-free glass sheet according to the embodiment of the present invention have a Young's modulus of 80 GPa or more, a strain point of 700° C. or more, and a liquidus temperature of 1,350° C. or less. Herein, the "Young's modulus" refers to a value measured by a flexural resonance method. 1 GPa corresponds to about 101.9 Kgf/mm². The "strain point" refers to a value measured based on a method of ASTM C336. The "liquidus temperature" refers to a temperature at which a crystal precipitates after glass powder having passed through a standard 30-mesh sieve (500 μm) and remained on a 50-mesh sieve (300 μm) is placed in a platinum boat and kept for 24 hours in a gradient heating furnace.

In addition, it is preferred that the alkali-free glass sheet according to any one of the embodiments of the present invention be further substantially free of $As_2O_3$ and $Sb_2O_3$. Herein, the "substantially free of $As_2O_3$" refers to the case in which the content of $As_2O_3$ is 0.05 mol % or less. The "substantially free of $Sb_2O_3$" refers to the case in which the content of $Sb_2O_3$ is 0.05 mol % or less.

In addition, it is preferred that the alkali-free glass sheet according to any one of the embodiments of the present invention further comprise 0.001 mol % to 1 mol % of $SnO_2$.

In addition, it is preferred that the alkali-free glass sheet according to any one of the embodiments of the present invention have a strain point of 710° C. or more.

In addition, it is preferred that the alkali-free glass sheet according to any one of the embodiments of the present invention have a Young's modulus of more than 81 GPa.

In addition, it is preferred that the alkali-free glass sheet according to any one of the embodiments of the present invention have an average thermal expansion coefficient within a temperature range of from 30° C. to 380° C. of from $30×10^{-7}/°$ C. to $50×10^{-7}/°$ C. Herein, the "average thermal expansion coefficient within a temperature range of from 30° C. to 380° C." may be measured with a dilatometer.

In addition, it is preferred that the alkali-free glass sheet according to any one of the embodiments of the present invention have a liquidus viscosity of $10^{4.0}$ dPa·s or more. Herein, the "liquidus viscosity" refers to a glass viscosity at the liquidus temperature, and may be measured by a platinum sphere pull up method.

In addition, it is preferred that the alkali-free glass sheet according to any one of the embodiments of the present invention be used for an OLED device.

In addition, according to one embodiment of the present invention, there is provided an alkali-free glass sheet, which has a content of $Li_2O+Na_2O+K_2O$ of from 0 mol % to 0.5 mol % in a glass composition, and has a Young's modulus of 80 GPa or more, a strain point of 700° C. or more, and a liquidus temperature of 1,350° C. or less.

DESCRIPTION OF EMBODIMENTS

An alkali-free glass sheet of the present invention comprises as a glass composition, in terms of mol %, 64% to 71% of $SiO_2$, 12.5% to 17% of $Al_2O_3$, 0% to 4% of $B_2O_3$, 0% to 0.5% of $Li_2O+Na_2O+K_2O$, 6% to 11% of MgO, 3% to 11% of CaO, 0% to 6% of SrO, 0% to 1% of BaO, and 14% to 19% of MgO+CaO+SrO+BaO, and has a mole percent ratio $(Al_2O_3/CaO)×\{B_2O_3/(MgO+CaO+SrO+BaO)\}$ of from 0 to 0.5, a mole percent ratio MgO/(CaO+SrO) of from 0.5 to 1.5, a mole percent ratio $(MgO+CaO+SrO+BaO—Al_2O_3)×B_2O_3$ of from 1 to 10, and a mole percent ratio $SiO_2×CaO/MgO$ of from 30 to 90. The reasons why the contents of the components are limited as described above are described below. In the descriptions of the contents of the components, the expression "%" represents "mol %", unless otherwise specified.

$SiO_2$ is a component which forms the skeleton of glass. When the content of $SiO_2$ is too small, a thermal expansion coefficient is increased, and a density is increased. Accordingly, the lower limit content of $SiO_2$ is preferably 64%, still more preferably 64.2%, still more preferably 64.5%, still more preferably 64.8%, still more preferably 65%, still more preferably 65.5%, still more preferably 65.8%, still more preferably 66%, still more preferably 66.3%, still more preferably 66.5%, most preferably 66.7%. Meanwhile, when the content of $SiO_2$ is too large, a Young's modulus is reduced. Further, a viscosity at high temperature is increased, resulting in an increase in amount of heat required for melting. This causes a rise in melting cost, and in addition, leads to occurrence of an unmelted residue of a raw material for introducing $SiO_2$, which may cause a reduction in yield. In addition, a devitrified crystal such as cristobalite is liable to precipitate, and a liquidus viscosity is liable to be reduced. Accordingly, the upper limit content of $SiO_2$ is preferably 71%, still more preferably 70.8%, still more preferably 70.6%, still more preferably 71.4%, still more preferably 70.2%, still more preferably 70%, still more preferably 69.8%, still more preferably 69%, most preferably 68%.

$Al_2O_3$ is a component which forms the skeleton of the glass, and is also a component which increases the Young's modulus, and is further a component which increases a strain point. When the content of $Al_2O_3$ is too small, the Young's modulus is liable to be reduced, and the strain point is liable to be reduced. Accordingly, the lower limit content of $Al_2O_3$ is preferably 12.5%, more preferably 13%, more preferably more than 13%, more preferably 13.1%, still more preferably 13.2%, still more preferably 13.3%, most preferably 13.4%. Meanwhile, when the content of $Al_2O_3$ is too large, a devitrified crystal such as mullite is liable to precipitate, and the liquidus viscosity is liable to be reduced. Accordingly, the upper limit content of $Al_2O_3$ is preferably 17%, more preferably 16.8%, more preferably 16.6%, still more preferably 16.4%, still more preferably 16.2%, still more preferably 16%, still more preferably 15.5%, still more preferably 15%, still more preferably 14.5%, most preferably 14%.

$B_2O_3$ is a component which improves the meltability and the devitrification resistance. When the content of $B_2O_3$ is too small, the meltability and the devitrification resistance are liable to be reduced. Accordingly, the lower limit content of $B_2O_3$ is preferably 0%, more preferably more than 0%, more preferably 0.1%, still more preferably 0.2%, still more preferably 0.3%, still more preferably 0.4%, still more preferably 0.7%, still more preferably 1%, particularly preferably more than 1%. Meanwhile, when the content of $B_2O_3$ is too large, the Young's modulus and the strain point are liable to be reduced. Accordingly, the upper limit content of $B_2O_3$ is preferably 4%, more preferably 3.9%, more preferably 3.8%, still more preferably 3.7%, still more preferably 3.6%, still more preferably 3.5%, still more preferably 3%, still more preferably 2.5%, still more preferably 2%, still more preferably 1.5%, most preferably less than 1%.

$Li_2O$, $Na_2O$, and $K_2O$ are each a component which is inevitably mixed in from glass raw materials, and the total content thereof is from 0% to 0.5%, preferably from 0% to 0.3%, more preferably from 0% to 0.2%, still more preferably from 0 to 0.1, most preferably from 0% to 0.05%. When the total content of $Li_2O$, $Na_2O$, and $K_2O$ is too large, a situation in which an alkali ion is diffused in a heat treatment step into a semiconductor substance having been formed into a film may occur.

MgO is a component which remarkably increases the Young's modulus among alkaline earth metal oxides. When the content of MgO is too small, the meltability and the Young's modulus are liable to be reduced. Accordingly, the lower limit content of MgO is preferably 6%, more preferably 6.1%, more preferably 6.3%, still more preferably 6.5%, still more preferably 6.6%, still more preferably 6.7%, still more preferably 6.8%, most preferably 7%. Meanwhile, when the content of MgO is too large, a devitrified crystal such as mullite is liable to precipitate, and the liquidus viscosity is liable to be reduced. Accordingly, the upper limit content of MgO is preferably 11%, more preferably 10.5%, more preferably 10%, more preferably 9.5%, more preferably 9%, more preferably 8.9%, more preferably 8.8%, still more preferably 8.7%, still more preferably 8.6%, still more preferably 8.5%, still more preferably less than 8.5%, still more preferably 8.4%, still more preferably less than 8.4%, still more preferably 8.2%, most preferably less than 8.0%.

CaO is a component which reduces the viscosity at high temperature to remarkably improve the meltability without reducing the strain point. CaO is also a component which increases the Young's modulus. When the content of CaO is too small, the meltability is liable to be reduced. Accordingly, the lower limit content of CaO is preferably 3%, more preferably more than 3%, more preferably 3.1%, still more preferably 3.2%, still more preferably 3.3%, still more preferably 3.4%, still more preferably 3.5%, still more preferably 3.6%, still more preferably 4%, most preferably 4.5%. Meanwhile, when the content of CaO is too large, the liquidus temperature is increased. Accordingly, the upper limit content of CaO is preferably 11%, more preferably 10.5%, more preferably 10%, more preferably 9.9%, more preferably 9.8%, still more preferably 9.7%, still more preferably 9.6%, still more preferably 9.5%, still more preferably 9.4%, still more preferably 9.3%, most preferably 9.2%.

SrO is a component which improves the devitrification resistance, and is further a component which reduces the viscosity at high temperature to improve the meltability without reducing the strain point. SrO is also a component which suppresses a reduction in liquidus viscosity. When the content of SrO is too small, it becomes difficult to exhibit the above-mentioned effects. Accordingly, the lower limit content of SrO is preferably 0%, more preferably more than 0%, more preferably 0.1%, still more preferably more than 0.1%, still more preferably 0.2%, still more preferably 0.3%, still more preferably more than 0.3%, still more preferably 0.4%, still more preferably more than 0.4%, still more preferably 0.6%, most preferably more than 1%. Meanwhile, when the content of SrO is too large, the thermal expansion coefficient and the density are liable to be increased. Accordingly, the upper limit content of SrO is preferably 6%, more preferably less than 6%, more preferably 5.9%, still more preferably less than 5.9%, still more preferably 5.8%, still more preferably less than 5.8%, still more preferably 5.7%, still more preferably 5%, still more preferably less than 4%, most preferably 3.5%.

BaO is a component which improves the devitrification resistance. When the content of BaO is too small, it becomes difficult to exhibit the above-mentioned effect. Accordingly, the lower limit content of BaO is preferably 0%, more preferably more than 0%, more preferably 0.1%, still more preferably more than 0.1%, still more preferably 0.2%, still more preferably 0.3%, still more preferably 0.4%, still more preferably more than 0.4%, most preferably 0.5%. Meanwhile, when the content of BaO is too large, the Young's modulus is liable to be reduced, and the density is liable to be increased. As a result, a specific Young's modulus is increased, and the glass sheet is liable to be deflected. Accordingly, the upper limit content of BaO is preferably 1%, more preferably less than 1%, more preferably 0.9%, still more preferably less than 0.9%, still more preferably 0.8%, still more preferably less than 0.8%, most preferably 0.7%.

When the total content of MgO, CaO, SrO, and BaO is too small, the meltability is liable to be reduced. Accordingly, the lower limit of the total content of MgO, CaO, SrO, and BaO is preferably 14%, more preferably 15%, more preferably 15.1%, more preferably 15.2%, still more preferably 15.3%, still more preferably 15.4%, still more preferably 15.7%, still more preferably 16%, most preferably 16.5%. Meanwhile, when the total content of MgO, CaO, SrO, and BaO is too large, the thermal expansion coefficient and the density are liable to be increased. Accordingly, the upper limit of the total content of MgO, CaO, SrO, and BaO is preferably 19%, more preferably 18.8%, more preferably 18.6%, still more preferably 18.5%, still more preferably less than 18.5%, still more preferably 18.4%, most preferably less than 18.4%.

The mole percent ratio $(Al_2O_3/CaO) \times \{B_2O_3/(MgO+CaO+SrO+BaO)\}$ is an important component ratio for achieving a high Young's modulus, high thermal dimensional stability, and high productivity, particularly high meltability and a high liquidus viscosity required for forming by an overflow down-draw method. When the mole percent ratio $(Al_2O_3/CaO) \times \{B_2O_3/(MgO+CaO+SrO+BaO)\}$ is too small, the meltability is liable to be reduced, with the result that the cost of the glass is liable to rise. Accordingly, the lower limit of the mole percent ratio $(Al_2O_3/CaO) \times \{B_2O_3/(MgO+CaO+SrO+BaO)\}$ is preferably 0, more preferably more than 0, more preferably 0.02, still more preferably 0.05, still more preferably 0.08, most preferably 0.1. Meanwhile, when the mole percent ratio $(Al_2O_3/CaO) \times \{B_2O_3/(MgO+CaO+SrO+BaO)\}$ is too large, the strain point is liable to be reduced, with the result that high thermal dimensional stability is not obtained. In addition, the Young's modulus is liable to be reduced. Further, the liquidus viscosity is liable to be reduced, with the result that the productivity is liable to be reduced. Accordingly, the upper limit of the mole percent ratio $(Al_2O_3/CaO) \times \{B_2O_3/(MgO+CaO+SrO+BaO)\}$ is preferably 0.5, more preferably 0.45, more preferably less than 0.45, still more preferably 0.4, still more preferably 0.37, still more preferably 0.36, still more preferably 0.35, still more preferably 0.33, still more preferably 0.30, still more preferably 0.29, still more preferably 0.25, still more preferably 0.22, most preferably 0.19.

When the mole percent ratio $MgO/(CaO+SrO)$ is too small, the meltability is liable to be reduced, with the result that the cost of the glass is liable to rise. Accordingly, the lower limit of the mole percent ratio $MgO/(CaO+SrO)$ is preferably 0.5, more preferably 0.52, more preferably 0.55, still more preferably 0.56, still more preferably 0.58, most preferably 0.6. When the mole percent ratio $MgO/(CaO+SrO)$ is too large, the liquidus viscosity is liable to be reduced. Accordingly, the upper limit of the mole percent ratio $MgO/(CaO+SrO)$ is preferably 1.5, more preferably 1.4, more preferably 1.3, still more preferably 1.2, still more preferably 1.1, most preferably 1.

The mole percent ratio $(MgO+CaO+SrO+BaO-Al_2O_3) \times B_2O_3$ is an important component ratio for achieving high thermal dimensional stability and high meltability. When the mole percent ratio $(MgO+CaO+SrO+BaO—Al_2O_3)×B_2O_3$ is too small, the meltability is liable to be reduced, with the result that the cost of the glass is liable to rise. Accordingly, the lower limit of the mole percent ratio $(MgO+CaO+SrO+BaO—Al_2O_3)×B_2O_3$ is preferably 1, more preferably 1.2, more preferably 1.4, still more preferably 1.6, still more preferably 1.8, still more preferably 2, still more preferably 2.8, still more preferably 3.2, still more preferably 3.6, most preferably 4. Meanwhile, when the mole percent ratio $(MgO+CaO+SrO+BaO—Al_2O_3)×B_2O_3$ is too large, the strain point is liable to be reduced, with the result that high thermal dimensional stability is not obtained. Accordingly, the upper limit of the mole percent ratio $(MgO+CaO+SrO+BaO—Al_2O_3)×B_2O_3$ is preferably 10, more preferably 9.8, more preferably 9.6, still more preferably 9.4, still more preferably 9.2, still more preferably 9, still more preferably 8.5, still more preferably 8, still more preferably 7.5, still more preferably 7, still more preferably 6.5, most preferably 6.

The mole percent ratio $SiO_2×CaO/MgO$ is an important component ratio for achieving a high Young's modulus, high thermal dimensional stability, and high productivity. Further, even when the mole percent ratio $SiO_2×CaO/MgO$ is too large or too small, the liquidus temperature is liable to be increased. It is required to strictly control the mole percent ratio $SiO_2×CaO/MgO$ for improving the devitrification resistance. When the mole percent ratio $SiO_2×CaO/MgO$ is too small, the strain point is liable to be reduced, with the result that the thermal dimensional stability is liable to be reduced. In addition, the Young's modulus is liable to be reduced. Accordingly, the lower limit of the mole percent ratio $SiO_2×CaO/MgO$ is preferably 30, more preferably 33, more preferably 35, still more preferably 38, still more preferably 40, still more preferably 43, still more preferably 45, still more preferably 47, still more preferably 48, still more preferably 50, still more preferably 52, still more preferably 53, still more preferably 55, most preferably 57. Meanwhile, when the mole percent ratio $SiO_2×CaO/MgO$ is too large, the meltability is liable to be reduced, with the result that the cost of the glass is liable to rise. Accordingly, the upper limit of the mole percent ratio $SiO_2×CaO/MgO$ is preferably 90, more preferably 87, more preferably 85, still more preferably 83, still more preferably 81, still more preferably 80, still more preferably 79, still more preferably 77, still more preferably 75, still more preferably 73, most preferably 71.

From the foregoing, in order to optimize the effects exhibited by the components and component ratios, the glass sheet more preferably comprises as a glass composition, in terms of mol %, for example, 66.7% to 70% of $SiO_2$, more than 13% to 16% of $Al_2O_3$, 0% to 4% of $B_2O_3$, 0% to 0.5% of $Li_2O+Na_2O+K_2O$, 7% to 11% of MgO, 3% to 11% of CaO, more than 0% to 6% of SrO, 0% to 1% of BaO, and 15% to less than 18.4% of MgO+CaO+SrO+BaO, and has a mole percent ratio $(Al_2O_3/CaO)×\{B_2O_3/(MgO+CaO+SrO+BaO)\}$ of from 0 to 0.3, a mole percent ratio MgO/(CaO+SrO) of from 0.6 to 1, a mole percent ratio $(MgO+CaO+SrO+BaO—Al_2O_3)×B_2O_3$ of from 2 to 9, and a mole percent ratio $SiO_2×CaO/MgO$ of from 57 to 83, or comprises as a glass composition, in terms of mol %, 66.7% to 70% of $SiO_2$, 13% to 16% of $Al_2O_3$, 0% to 4% of $B_2O_3$, 0% to 0.5% of $Li_2O+Na_2O+K_2O$, 6.8% to 11% of MgO, 3% to 11% of CaO, 0% to 6% of SrO, 0% to 1% of BaO, and 15% to 18.4% of MgO+CaO+SrO+BaO, and has a mole percent ratio $(Al_2O_3/CaO)×\{B_2O_3/(MgO+CaO+SrO+BaO)\}$ of from 0 to 0.3, a mole percent ratio MgO/(CaO+SrO) of from 0.6 to 1, a mole percent ratio $(MgO+CaO+SrO+BaO—Al_2O_3)×B_2O_3$ of from 2 to 9, and a mole percent ratio $SiO_2×CaO/MgO$ of from 57 to 83.

For example, the following components may be added as optional components in addition to the above-mentioned components. The content of the components other than the above-mentioned components, in terms of total content, is preferably 10% or less, particularly preferably 5% or less from the viewpoint of appropriately exhibiting the effects of the present invention.

$P_2O_5$ is a component which increases the strain point, and is also a component which can remarkably suppress the precipitation of an alkaline earth aluminosilicate-based devitrified crystal such as anorthite. However, when $P_2O_5$ is contained in a large amount, the glass is liable to undergo phase separation. The content of $P_2O_5$ is preferably from 0% to 2.5%, more preferably from 0.0005% to 1.5%, still more preferably from 0.001% to 0.5%, particularly preferably from 0.005% to 0.3%.

$TiO_2$ is a component which reduces the viscosity at high temperature to improve the meltability, and is also a component which suppresses solarization. However, when $TiO_2$ is contained in a large amount, the glass is colored, and thus a transmittance is liable to be reduced. The content of $TiO_2$ is preferably from 0% to 2.5%, more preferably from 0.0005% to 1%, still more preferably from 0.001% to 0.5%, particularly preferably from 0.005% to 0.1%.

ZnO is a component which increases the meltability. However, when ZnO is contained in a large amount, the glass is liable to devitrify, and in addition, the strain point is liable to be reduced. The content of ZnO is preferably from 0% to 6%, from 0% to 5%, or from 0% to 4%, particularly preferably from 0% to less than 3%.

$Y_2O_3$, $Nb_2O_5$, and $La_2O_3$ each have an action of increasing the strain point, the Young's modulus, and the like. The total content and the individual contents of those components are each preferably from 0% to 5%, more preferably from 0% to 1%, still more preferably from 0% to 0.5%, particularly preferably from 0% to less than 0.5%. When the total content and the individual contents of $Y_2O_3$, $Nb_2O_5$, and $La_2O_3$ are too large, the density and raw material cost are liable to be increased.

$SnO_2$ is a component which exhibits a satisfactory fining action in a high temperature region. In addition, $SnO_2$ is a component which increases the strain point, and is also a component which reduces the viscosity at high temperature. The content of $SnO_2$ is preferably from 0% to 1%, from 0.001% to 1%, or from 0.01% to 0.5%, particularly preferably from 0.05% to 0.3%. When the content of $SnO_2$ is too large, a devitrified crystal of $SnO_2$ is liable to precipitate. When the content of $SnO_2$ is less than 0.001%, it becomes difficult to exhibit the above-mentioned effects.

$SnO_2$ is suitable as a fining agent as described above, but unless glass characteristics are impaired, F, $SO_3$, C, or metal powder of Al, Si, or the like may each be added as a fining agent in place of $SnO_2$ or together with $SnO_2$ at up to 5% (preferably up to 1%, particularly preferably up to 0.5%). In addition, $CeO_2$ or the like may also be added as a fining agent at up to 5% (preferably up to 1%, particularly preferably up to 0.5%).

$As_2O_3$ and $Sb_2O_3$ are each effective as a fining agent as well. However, $As_2O_3$ and $Sb_2O_3$ are each a component that increases an environmental load. In addition, $As_2O_3$ is a component that reduces solarization resistance. Accordingly, it is preferred that the alkali-free glass sheet of the present invention be substantially free of those components.

Cl is a component which promotes initial melting of a glass batch. In addition, when Cl is added, the action of the fining agent can be promoted. As a result thereof, while the melting cost is reduced, the lifetime of a glass production kiln can be prolonged. However, when the content of Cl is too large, the strain point is liable to be reduced. Accordingly, the content of Cl is preferably from 0% to 3%, more preferably from 0.0005% to 1%, particularly preferably from 0.001% to 0.5%. The following raw material may be used as a raw material for introducing Cl: an alkaline earth metal chloride such as strontium chloride, aluminum chloride, or the like.

$Fe_2O_3$ is a component which is inevitably mixed in from glass raw materials, and is also a component which reduces an electrical resistivity. The content of $Fe_2O_3$ is preferably from 0 ppm by mass to 300 ppm by mass or from 80 ppm by mass to 250 ppm by mass, particularly preferably from 100 ppm by mass to 200 ppm by mass. When the content of $Fe_2O_3$ is too small, the raw material cost is liable to rise. Meanwhile, when the content of $Fe_2O_3$ is too large, it becomes difficult to perform electric melting owing to an increase in electrical resistivity of the molten glass.

The alkali-free glass sheet of the present invention preferably has the following characteristics.

The average thermal expansion coefficient within a temperature range of from 30° C. to 380° C. is preferably from $30\times10^{-7}/°$ C. to $50\times10^{-7}/°$ C., from $32\times10^{-7}/°$ C. to $48\times10^{-7}/°$ C., from $33\times10^{-7}/°$ C. to $45\times10^{-7}/°$ C., or from $34\times10^{-7}/°$ C. to $44\times10^{-7}/°$ C., particularly preferably from $35\times10^{-7}/°$ C. to $43\times10^{-7}/°$ C. With this configuration, the thermal expansion coefficient easily matches the thermal expansion coefficient of Si to be used for a TFT.

The Young's modulus is preferably 80 GPa or more, more than 80 GPa, 81 GPa or more, 81.5 GPa or more, 82 GPa or more, 82.5 GPa or more, 83 GPa or more, 83.5 GPa or more, 84 GPa or more, 84.5 GPa or more, particularly preferably from more than 85 GPa to 120 GPa. When the Young's modulus is too low, defects due to the deflection of the glass sheet are liable to occur.

The strain point is preferably 700° C. or more, 705° C. or more, 710° C. or more, 715° C. or more, 720° C. or more, 725° C. or more, 730° C. or more, 732° C. or more, 735° C. or more, 737° C. or more, particularly preferably from 740° C. to 800° C. With this configuration, the thermal shrinkage of the glass sheet can be suppressed in an LTPS process.

The liquidus temperature is preferably 1,350° C. or less, less than 1,350° C., 1,300° C. or less, 1,290° C. or less, 1,285° C. or less, 1,280° C. or less, 1,275° C. or less, 1,270° C. or less, particularly preferably from 1,260° C. to 1,200° C. With this configuration, a situation in which a devitrified crystal is generated at the time of glass manufacture, resulting in a reduction in productivity, is easily prevented. Further, the glass sheet is easily formed by an overflow down-draw method, and hence the surface quality of the glass sheet is easily improved. Besides, the manufacturing cost of the glass sheet can be reduced. The liquidus temperature serves as an indicator of the devitrification resistance. As the liquidus temperature becomes lower, the devitrification resistance is more excellent.

The liquidus viscosity is preferably $10^{4.0}$ dPa·s or more, $10^{4.1}$ dPa·s or more, or $10^{42}$ dPa·s or more, particularly preferably from $10^{4.3}$ dPa·s to $10^{7.0}$ dPa·s. With this configuration, devitrification is less liable to occur at the time of forming, and hence the glass sheet is easily formed by an overflow down-draw method. As a result, the surface quality of the glass sheet can be improved. Besides, the manufacturing cost of the glass sheet can be reduced. The liquidus viscosity serves as indicators of the devitrification resistance and the formability. As the liquidus viscosity becomes higher, the devitrification resistance and the formability are improved more.

The temperature at a viscosity at high temperature of $10^{2.5}$ dPa·s is preferably 1,650° C. or less, 1,630° C. or less, or 1,610° C. or less, particularly preferably from 1,400° C. to 1,600° C. When the temperature at a viscosity at high temperature of $10^{2.5}$ dPa·s is too high, it becomes difficult to melt a glass batch, resulting in a rise in manufacturing cost of the glass sheet. The temperature at a viscosity at high temperature of $10^{2.5}$ dPa·s corresponds to a melting temperature. As the temperature becomes lower, the meltability is improved more.

The β-OH value is an indicator of the amount of water in the glass. When the β-OH value is reduced, the strain point can be increased. In addition, even with the same glass composition, a glass sheet having a smaller β-OH value has a lower thermal shrinkage rate at a temperature equal to or lower than the strain point. The β-OH value is preferably 0.35/mm or less, 0.30/mm or less, 0.28/mm or less, or 0.25/mm or less, particularly preferably 0.20/mm or less. When the β-OH value is too small, the meltability is liable to be reduced. Accordingly, the β-OH value is preferably 0.01/mm or more, particularly preferably 0.03/mm or more.

As a method of reducing the β-OH value, the following methods are given: (1) a method involving selecting raw materials having low water contents; (2) a method involving adding a component (such as Cl or $SO_3$) which reduces the β-OH value to the glass; (3) a method involving reducing the amount of water in a furnace atmosphere; (4) a method involving performing $N_2$ bubbling in molten glass; (5) a method involving adopting a small melting furnace; (6) a method involving increasing the flow rate of molten glass; and (7) a method involving adopting an electric melting method.

Herein, the "β-OH value" refers to a value determined using the following mathematical formula by measuring the transmittances of the glass with an FT-IR.

$$\beta\text{-OH value}=(1/X)\log(T_1/T_2)$$

X: Sheet thickness (mm)

$T_1$: Transmittance (%) at a reference wavelength of 3,846 cm$^{-1}$ $T_2$: Minimum transmittance (%) at a wavelength around a hydroxyl group absorption wavelength of 3,600 cm$^{-1}$ It is preferred that the alkali-free glass sheet of the present invention be formed by an overflow down-draw method. The overflow down-draw method refers to a method in which molten glass is caused to overflow from both sides of a heat-resistant trough-shaped structure, and the overflowing molten glass is subjected to down-draw downward at the lower end of the trough-shaped structure while being joined, to thereby manufacture the glass sheet. By the overflow down-draw method, surfaces which are to serve as the surfaces of the glass sheet are formed in a state of free surfaces without being brought into contact with the trough-shaped refractory. As a result, a glass sheet having good surface quality can be manufactured without polishing at low cost, and a reduction in thickness is easily achieved as well.

Other than the overflow down-draw method, the glass sheet may be formed by, for example, a down-draw method (such as a slot down method) or a float method.

The sheet thickness of the alkali-free glass sheet of the present invention is not particularly limited, but is preferably less than 0.7 mm, 0.6 mm or less, or less than 0.6 mm, particularly preferably from 0.05 mm to 0.5 mm. As the sheet thickness becomes smaller, the weight saving of an OLED device can be achieved more. The sheet thickness may be adjusted based on, for example, a flow rate and a sheet-drawing speed at the time of glass manufacture.

The alkali-free glass sheet of the present invention is preferably used as a substrate of a display panel for an OLED device, particularly for an OLED TV, or as a carrier for manufacturing an OLED display panel. In particular, in OLED TV applications, a plurality of devices are formed on the glass sheet, and the glass sheet is then cut and divided into the respective devices to achieve cost-cutting (so-called multiple patterning). The alkali-free glass sheet of the present invention has a low liquidus temperature and a high liquidus viscosity, and hence a large glass sheet is easily formed, and thus such demand can be appropriately satisfied.

Examples

The present invention is hereinafter described by way of Examples. Examples below are merely examples, and the present invention is by no means limited to Examples below.

Examples (Sample Nos. 1 to 32) of the present invention are shown in Tables 1 to 3.

TABLE 1

| | | No. 1 | No. 2 | No. 3 | No. 4 | No. 5 | No. 6 | No. 7 | No. 8 | No. 9 | No. 10 | No. 11 |
|---|---|---|---|---|---|---|---|---|---|---|---|---|
| Glass composition (mol %) | $SiO_2$ | 65.9 | 65.9 | 65.9 | 65.9 | 65.9 | 65.9 | 66.9 | 66.9 | 68.9 | 68.9 | 68.9 |
| | $Al_2O_3$ | 15.0 | 15.0 | 15.0 | 15.0 | 14.0 | 14.0 | 14.0 | 14.0 | 13.5 | 13.5 | 13.5 |
| | $B_2O_3$ | 2.0 | 2.0 | 2.0 | 2.0 | 2.0 | 2.0 | 2.0 | 1.0 | 1.0 | 1.0 | 1.0 |
| | $Li_2O$ | 0.00 | 0.00 | 0.00 | 0.00 | 0.00 | 0.00 | 0.00 | 0.00 | 0.00 | 0.00 | 0.00 |
| | $Na_2O$ | 0.02 | 0.01 | 0.01 | 0.02 | 0.03 | 0.02 | 0.02 | 0.02 | 0.02 | 0.01 | 0.01 |
| | $K_2O$ | 0.00 | 0.00 | 0.00 | 0.00 | 0.00 | 0.00 | 0.00 | 0.00 | 0.00 | 0.00 | 0.00 |
| | MgO | 7.0 | 7.0 | 8.0 | 8.0 | 7.0 | 8.0 | 7.0 | 7.0 | 7.0 | 7.0 | 7.0 |
| | CaO | 6.0 | 4.0 | 6.0 | 4.0 | 7.0 | 6.0 | 6.0 | 7.0 | 9.0 | 7.0 | 5.0 |
| | SrO | 3.0 | 5.0 | 3.0 | 5.0 | 3.0 | 3.0 | 3.0 | 3.0 | 0.5 | 2.5 | 4.5 |
| | BaO | 1.0 | 1.0 | 0.0 | 0.0 | 1.0 | 1.0 | 1.0 | 1.0 | 0.0 | 0.0 | 0.0 |
| | $SnO_2$ | 0.1 | 0.1 | 0.1 | 0.1 | 0.1 | 0.1 | 0.1 | 0.1 | 0.1 | 0.1 | 0.1 |
| $Li_2O + Na_2O + K_2O$ | | 0.02 | 0.02 | 0.02 | 0.02 | 0.03 | 0.02 | 0.02 | 0.02 | 0.02 | 0.02 | 0.02 |
| MgO + CaO + SrO + BaO | | 17.0 | 17.0 | 17.0 | 17.0 | 18.0 | 18.0 | 17.0 | 18.0 | 16.5 | 16.5 | 16.5 |
| $(Al_2O_3/CaO) \times \{B_2O_3/(MgO + CaO + SrO + BaO)\}$ | | 0.29 | 0.44 | 0.29 | 0.44 | 0.22 | 0.26 | 0.27 | 0.11 | 0.09 | 0.12 | 0.16 |
| $MgO/(CaO + SrO)$ | | 0.78 | 0.78 | 0.89 | 0.89 | 0.70 | 0.89 | 0.78 | 0.70 | 0.74 | 0.74 | 0.74 |
| $(MgO + CaO + SrO + BaO - Al_2O_3) \times B_2O_3$ | | 4.00 | 4.00 | 4.00 | 4.00 | 8.00 | 8.00 | 6.00 | 4.00 | 3.00 | 3.00 | 3.00 |
| $SiO_2 \times CaO/MgO$ | | 56.5 | 37.7 | 49.4 | 33.0 | 65.9 | 49.4 | 57.4 | 66.9 | 88.6 | 68.9 | 49.2 |
| CTE [$\times 10^{-7}$/° C.] | | 37.4 | 38.6 | 37.1 | 37.7 | 39.6 | 38.9 | 38.1 | 39.6 | 36 | 36.6 | 37.3 |
| Density [g/cm³] | | 2.59 | 2.62 | 2.56 | 2.59 | 2.59 | 2.59 | 2.58 | 2.60 | 2.51 | 2.54 | 2.57 |
| Young's modulus [GPa] | | 86 | 85 | 87 | 87 | 86 | 86 | 85 | 86 | 87 | 86 | 86 |
| Ps [° C.] | | 741 | 741 | 741 | 742 | 733 | 733 | 737 | 744 | 753 | 750 | 750 |
| Ta [° C.] | | 796 | 798 | 796 | 798 | 788 | 788 | 793 | 800 | 806 | 806 | 807 |
| Ts [° C.] | | 1,014 | 1,017 | 1,011 | 1,014 | 1,007 | 1,006 | 1,015 | 1,019 | 1,029 | 1,030 | 1,032 |
| $10^4$ dPa · s [° C.] | | 1,302 | 1,306 | 1,296 | 1,305 | 1,294 | 1,295 | 1,306 | 1,309 | 1,325 | 1,331 | 1,338 |
| $10^3$ dPa · s [° C.] | | 1,448 | 1,453 | 1,442 | 1,452 | 1,442 | 1,444 | 1,456 | 1,458 | 1,479 | 1,488 | 1,495 |
| $10^{2.5}$ dPa · s [° C.] | | 1,543 | 1,548 | 1,536 | 1,549 | 1,538 | 1,540 | 1,554 | 1,556 | 1,577 | 1,586 | 1,597 |
| TL [° C.] | | 1,265 | 1,269 | 1,295 | 1,294 | 1,243 | 1,245 | 1,222 | 1,266 | 1,282 | 1,263 | 1,259 |
| $Log_{10}\eta TL$ | | 4.3 | 4.3 | 4.0 | 4.1 | 4.5 | 4.5 | 4.8 | 4.4 | 4.4 | 4.6 | 4.7 |

TABLE 2

| | | No. 12 | No. 13 | No. 14 | No. 15 | No. 16 | No. 17 | No. 18 | No. 19 | No. 20 | No. 21 | No. 22 |
|---|---|---|---|---|---|---|---|---|---|---|---|---|
| Glass composition (mol %) | $SiO_2$ | 67.9 | 67.9 | 67.9 | 67.3 | 67.6 | 67.6 | 67.6 | 67.6 | 67.6 | 67.3 | 67.6 |
| | $Al_2O_3$ | 13.5 | 13.5 | 13.5 | 13.8 | 13.8 | 13.5 | 13.8 | 13.5 | 13.5 | 13.5 | 13.5 |
| | $B_2O_3$ | 1.0 | 1.0 | 1.0 | 1.5 | 1.5 | 1.5 | 1.5 | 1.5 | 1.5 | 1.5 | 1.5 |
| | $Li_2O$ | 0.00 | 0.00 | 0.00 | 0.00 | 0.00 | 0.00 | 0.00 | 0.00 | 0.00 | 0.00 | 0.00 |
| | $Na_2O$ | 0.01 | 0.01 | 0.01 | 0.03 | 0.02 | 0.02 | 0.02 | 0.03 | 0.02 | 0.02 | 0.02 |
| | $K_2O$ | 0.00 | 0.00 | 0.00 | 0.00 | 0.00 | 0.00 | 0.00 | 0.00 | 0.00 | 0.00 | 0.00 |
| | MgO | 8.0 | 8.0 | 8.0 | 7.6 | 7.6 | 7.6 | 7.6 | 7.6 | 7.9 | 7.9 | 7.6 |
| | CaO | 9.0 | 7.0 | 5.0 | 6.5 | 6.5 | 6.5 | 6.5 | 7.0 | 7.0 | 7.0 | 6.8 |
| | SrO | 0.5 | 2.5 | 4.5 | 2.8 | 2.8 | 3.0 | 3.0 | 2.8 | 2.5 | 2.5 | 2.8 |
| | BaO | 0.0 | 0.0 | 0.0 | 0.5 | 0.3 | 0.3 | 0.0 | 0.0 | 0.0 | 0.3 | 0.3 |
| | $SnO_2$ | 0.1 | 0.1 | 0.1 | 0.1 | 0.1 | 0.1 | 0.1 | 0.1 | 0.1 | 0.1 | 0.1 |
| $Li_2O + Na_2O + K_2O$ | | 0.02 | 0.02 | 0.02 | 0.03 | 0.03 | 0.03 | 0.02 | 0.04 | 0.02 | 0.02 | 0.02 |
| MgO + CaO + SrO + BaO | | 17.5 | 17.5 | 17.5 | 17.4 | 17.1 | 17.4 | 17.1 | 17.4 | 17.4 | 17.6 | 17.4 |
| $(Al_2O_3/CaO) \times \{B_2O_3/(MgO + CaO + SrO + BaO)\}$ | | 0.09 | 0.11 | 0.15 | 0.18 | 0.19 | 0.18 | 0.19 | 0.17 | 0.17 | 0.16 | 0.17 |
| $MgO/(CaO + SrO)$ | | 0.84 | 0.84 | 0.84 | 0.82 | 0.82 | 0.80 | 0.80 | 0.78 | 0.83 | 0.83 | 0.80 |
| $(MgO + CaO + SrO + BaO - Al_2O_3) \times B_2O_3$ | | 4.00 | 4.00 | 4.00 | 5.40 | 5.03 | 5.78 | 5.03 | 5.78 | 5.78 | 6.15 | 5.78 |
| $SiO_2 \times CaO/MgO$ | | 76.4 | 59.4 | 42.4 | 57.6 | 57.8 | 57.8 | 57.8 | 62.2 | 60.2 | 60.0 | 60.0 |
| CTE [$\times 10^{-7}$/° C.] | | 37.2 | 37.6 | 38.2 | 37.6 | 37 | 37.7 | 37.1 | 37.4 | 37.2 | 37.6 | 37.5 |
| Density [g/cm³] | | 2.52 | 2.55 | 2.58 | 2.56 | 2.55 | 2.56 | 2.55 | 2.55 | 2.54 | 2.55 | 2.55 |
| Young's modulus [GPa] | | 88 | 87 | 87 | 86 | 86 | 86 | 87 | 87 | 87 | 87 | 86 |

TABLE 2-continued

|  | No. 12 | No. 13 | No. 14 | No. 15 | No. 16 | No. 17 | No. 18 | No. 19 | No. 20 | No. 21 | No. 22 |
|---|---|---|---|---|---|---|---|---|---|---|---|
| Ps [° C.] | 747 | 747 | 747 | 739 | 741 | 738 | 741 | 738 | 739 | 738 | 738 |
| Ta [° C.] | 801 | 802 | 802 | 794 | 796 | 794 | 796 | 793 | 794 | 793 | 794 |
| Ts [° C.] | 1,018 | 1,021 | 1,023 | 1,015 | 1,017 | 1,015 | 1,017 | 1,014 | 1,015 | 1,013 | 1,016 |
| $10^4$ dPa · s [° C.] | 1,310 | 1,313 | 1,316 | 1,311 | 1,314 | 1,313 | 1,312 | 1,312 | 1,310 | 1,308 | 1,312 |
| $10^3$ dPa · s [° C.] | 1,461 | 1,464 | 1,469 | 1,462 | 1,465 | 1,464 | 1,462 | 1,462 | 1,458 | 1,455 | 1,460 |
| $10^{2.5}$ dPa · s [° C.] | 1,559 | 1,562 | 1,568 | 1,557 | 1,561 | 1,560 | 1,558 | 1,557 | 1,553 | 1,549 | 1,555 |
| TL [° C.] | 1,255 | 1,243 | 1,273 | 1,240 | 1,255 | 1,240 | 1,246 | 1,239 | 1,247 | 1,246 | 1,228 |
| $Log_{10}\eta$TL | 4.5 | 4.6 | 4.4 | 4.6 | 4.5 | 4.7 | 4.6 | 4.7 | 4.6 | 4.6 | 4.8 |

TABLE 3

|  |  | No. 23 | No. 24 | No. 25 | No. 26 | No. 27 | No. 28 | No. 29 | No. 30 | No. 31 | No. 32 |
|---|---|---|---|---|---|---|---|---|---|---|---|
| Glass composition (mol %) | $SiO_2$ | 68.0 | 67.9 | 68.5 | 68.5 | 67.9 | 67.9 | 68.0 | 68.2 | 69.9 | 68.9 |
|  | $Al_2O_3$ | 13.5 | 13.5 | 13.5 | 13.5 | 13.5 | 13.4 | 13.5 | 13.3 | 13.0 | 13.0 |
|  | $B_2O_3$ | 1.0 | 1.0 | 1.0 | 1.5 | 1.0 | 1.1 | 1.5 | 1.5 | 2.0 | 3.0 |
|  | $Li_2O$ | 0.00 | 0.00 | 0.00 | 0.00 | 0.00 | 0.00 | 0.00 | 0.00 | 0.00 | 0.00 |
|  | $Na_2O$ | 0.02 | 0.01 | 0.02 | 0.01 | 0.03 | 0.02 | 0.02 | 0.02 | 0.02 | 0.01 |
|  | $K_2O$ | 0.01 | 0.00 | 0.01 | 0.00 | 0.01 | 0.00 | 0.00 | 0.00 | 0.00 | 0.00 |
|  | MgO | 8.0 | 8.1 | 7.5 | 7.5 | 8.0 | 8.0 | 7.5 | 7.5 | 7.0 | 7.0 |
|  | CaO | 9.0 | 9.0 | 9.0 | 8.5 | 9.1 | 9.1 | 9.0 | 9.0 | 8.0 | 8.0 |
|  | SrO | 0.4 | 0.4 | 0.4 | 0.4 | 0.4 | 0.4 | 0.4 | 0.4 | 0.0 | 0.0 |
|  | BaO | 0.0 | 0.0 | 0.0 | 0.0 | 0.0 | 0.0 | 0.0 | 0.0 | 0.0 | 0.0 |
|  | $SnO_2$ | 0.1 | 0.1 | 0.1 | 0.1 | 0.1 | 0.1 | 0.1 | 0.1 | 0.1 | 0.1 |
| $Li_2O + Na_2O + K_2O$ |  | 0.02 | 0.01 | 0.02 | 0.01 | 0.04 | 0.02 | 0.02 | 0.02 | 0.03 | 0.01 |
| MgO + CaO + SrO + BaO |  | 17.4 | 17.5 | 16.9 | 16.4 | 17.5 | 17.5 | 16.9 | 16.9 | 15.1 | 15.1 |
| $(Al_2O_3/CaO) \times \{B_2O_3/(MgO + CaO + SrO + BaO)\}$ |  | 0.09 | 0.09 | 0.09 | 0.15 | 0.08 | 0.09 | 0.13 | 0.13 | 0.22 | 0.32 |
| MgO/(CaO + SrO) |  | 0.85 | 0.86 | 0.80 | 0.84 | 0.84 | 0.84 | 0.80 | 0.80 | 0.88 | 0.88 |
| $(MgO + CaO + SrO + BaO - Al_2O_3) \times B_2O_3$ |  | 3.90 | 4.00 | 3.40 | 4.35 | 4.00 | 4.51 | 5.10 | 5.40 | 4.18 | 6.27 |
| $SiO_2 \times CaO/MgO$ |  | 76.5 | 75.5 | 82.2 | 77.6 | 77.2 | 77.2 | 81.6 | 81.9 | 79.9 | 78.8 |
| CTE [$\times 10^{-7}$/° C.] |  | 36.5 | 36.6 | 36.0 | 34.6 | 36.8 | 36.8 | 36.4 | 36.3 | 33.6 | 33.8 |
| Density [g/cm³] |  | 2.51 | 2.52 | 2.51 | 2.50 | 2.52 | 2.51 | 2.51 | 2.50 | 2.47 | 2.47 |
| Young's modulus [GPa] |  | 88 | 88 | 87 | 87 | 88 | 88 | 87 | 87 | 86 | 85 |
| Ps [° C.] |  | 747 | 747 | 749 | 746 | 747 | 745 | 743 | 743 | 744 | 734 |
| Ta [° C.] |  | 802 | 802 | 805 | 801 | 802 | 800 | 798 | 798 | 800 | 790 |
| Ts [° C.] |  | 1,019 | 1,018 | 1,024 | 1,021 | 1,018 | 1,017 | 1,017 | 1,017 | 1,027 | 1,017 |
| $10^4$ dPa · s [° C.] |  | 1,311 | 1,311 | 1,320 | 1,320 | 1,311 | 1,310 | 1,313 | 1,316 | 1,338 | 1,322 |
| $10^3$ dPa · s [° C.] |  | 1,463 | 1,463 | 1,472 | 1,474 | 1,463 | 1,461 | 1,465 | 1,469 | 1,494 | 1,476 |
| $10^{2.5}$ dPa · s [° C.] |  | 1,560 | 1,560 | 1,569 | 1,571 | 1,559 | 1,557 | 1,561 | 1,566 | 1,595 | 1,574 |
| TL [° C.] |  | 1,261 | 1,265 | 1,263 | 1,257 | 1,253 | 1,255 | 1,247 | 1,241 | 1,260 | 1,245 |
| $Log_{10}\eta$TL |  | 4.4 | 4.4 | 4.5 | 4.6 | 4.5 | 4.5 | 4.6 | 4.7 | 4.7 | 4.7 |

First, a glass batch prepared by blending glass raw materials so as to achieve each of the glass compositions shown in the tables was loaded in a platinum crucible, and then melted at from 1,600° C. to 1,650° C. for 24 hours. In melting the glass batch, molten glass was stirred to be homogenized by using a platinum stirrer. Next, the molten glass was poured on a carbon sheet and formed into a sheet shape, followed by being annealed at a temperature around an annealing point for 30 minutes. Each of the resultant samples was evaluated for its average thermal expansion coefficient CTE within a temperature range of from 30° C. to 380° C., density, Young's modulus, strain point Ps, annealing point Ta, softening point Ts, temperature at a viscosity at high temperature of $10^4$ dPa·s, temperature at a viscosity at high temperature of $10^3$ dPa·s, temperature at a viscosity at high temperature of $10^{2.5}$ dPa·s, liquidus temperature TL, and viscosity $log_{10}\,\eta$TL at the liquidus temperature TL.

The average thermal expansion coefficient CTE within a temperature range of from 30° C. to 380° C. is a value measured with a dilatometer.

The density is a value measured by a well-known Archimedes method.

The Young's modulus refers to a value measured by a well-known resonance method.

The strain point Ps, the annealing point Ta, and the softening point Ts are values measured in accordance with methods specified in ASTM C336 and C338.

The temperatures at viscosities at high temperature of $10^4$ dPa·s, $10^3$ dPa·s, and $10^{2.5}$ dPa·s are values measured by a platinum sphere pull up method.

The liquidus temperature TL is a temperature at which a crystal precipitates after glass powder that has passed through a standard 30-mesh sieve (500 μm) and remains on a 50-mesh sieve (300 μm) is placed in a platinum boat and kept for 24 hours in a gradient heating furnace.

The liquidus viscosity $log_{10}\,\eta$TL is a value obtained by measuring the viscosity of the glass at the liquidus temperature TL by a platinum sphere pull up method.

As apparent from Table 1, each of Sample Nos. 1 to 32, in which the glass composition is restricted to the predetermined ranges, has a Young's modulus of 85 GPa or more, a strain point of 733° C. or more, a liquidus temperature of 1,295° C. or less, and a liquidus viscosity of $10^{4.0}$ dPa·s or more. Accordingly, each of Sample Nos. 1 to 32 is excellent in productivity and has a sufficiently high strain point and a sufficiently high Young's modulus, and is hence suitable as a substrate for an OLED device.

INDUSTRIAL APPLICABILITY

The alkali-free glass sheet of the present invention is suitable as a substrate of a display panel for an OLED device, particularly for an OLED TV, or as a carrier for manufacturing an OLED display panel. Other than those applications, the alkali-free glass sheet of the present invention is also suitable, for example, as a substrate for a flat panel display such as a liquid crystal display, a glass substrate for a magnetic recording medium, a cover glass for an image sensor, such as a charge coupled device (CCD) or a contact image sensor (CIS), a substrate and a cover glass for a solar cell, or a substrate for an OLED lighting device.

The invention claimed is:

1. An alkali-free glass sheet, comprising as a glass composition, in terms of mol %, 64% to 71% of $SiO_2$, 12.5% to 17% of $Al_2O_3$, 0.7% to 4% of $B_2O_3$, 0% to 0.5% of $Li_2O+Na_2O+K_2O$, 6% to 11% of MgO, 3% to 11% of CaO, 0% to 6% of SrO, 0% to 1% of BaO, 0.001% to 1% of $SnO_2$, and 14% to 19% of MgO+CaO+SrO+BaO, having a mole percent ratio $(Al_2O_3/CaO) \times \{B_2O_3/(MgO+CaO+SrO+$ BaO)$\}$ of from 0 to 0.5, a mole percent ratio MgO/(CaO+SrO) of from 0.5 to 1.5, a mole percent ratio $(MgO+CaO+SrO+BaO—Al_2O_3) \times B_2O_3$ of from 1 to 10, and a mole percent ratio $SiO_2 \times CaO/MgO$ of from 30 to 90, having a strain point of 740° C. or more, and having a liquidus temperature of 1270° C. or less.

2. The alkali-free glass sheet according to claim 1, wherein the alkali-free glass sheet has a Young's modulus of 80 GPa or more.

3. The alkali-free glass sheet according to claim 1, wherein the alkali-free glass sheet is further substantially free of $As_2O_3$ and $Sb_2O_3$.

4. The alkali-free glass sheet according to claim 1, wherein the alkali-free glass sheet has a Young's modulus of more than 81 GPa.

5. The alkali-free glass sheet according to claim 1, wherein the alkali-free glass sheet has an average thermal expansion coefficient within a temperature range of from 30° C. to 380° C. of from $30 \times 10^{-7}/°$ C. to $50 \times 10^{-7}/°$ C.

6. The alkali-free glass sheet according to claim 1, wherein the alkali-free glass sheet has a liquidus viscosity of $10^{4.0}$ dPa·s or more.

7. An organic light-emitting diode (OLED) device comprising the alkali-free glass sheet according to claim 1.

*   *   *   *   *